(12) United States Patent
Russell

(10) Patent No.: US 7,757,633 B2
(45) Date of Patent: Jul. 20, 2010

(54) METHOD, APPARATUS AND MAGNET ASSEMBLY FOR ENHANCING AND LOCALIZING A CAPACITIVELY COUPLED PLASMA

(75) Inventor: Derrek Andrew Russell, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 553 days.

(21) Appl. No.: 11/315,558

(22) Filed: Dec. 22, 2005

(65) Prior Publication Data
US 2006/0096538 A1 May 11, 2006

Related U.S. Application Data

(62) Division of application No. 10/324,213, filed on Dec. 20, 2002, now Pat. No. 7,059,268.

(51) Int. Cl.
*H01L 21/302* (2006.01)
(52) U.S. Cl. .................. 118/723 E; 118/723 MA; 156/345.46; 156/345.47
(58) Field of Classification Search .............. 118/723 E, 118/723 MA; 156/345.46, 345.47
See application file for complete search history.

(56) References Cited

U.S. PATENT DOCUMENTS

| | | | |
|---|---|---|---|
| 4,422,896 A | 12/1983 | Class | |
| 4,492,610 A | 1/1985 | Okano | |
| 4,525,262 A | 6/1985 | Class | |
| 4,581,118 A | 4/1986 | Class | |
| 4,624,767 A * | 11/1986 | Obinata | 204/298.37 |
| 4,632,719 A | 12/1986 | Chow | |
| 4,657,619 A | 4/1987 | O'Donnell | |
| 4,842,707 A | 6/1989 | Kinoshita | |
| 4,871,433 A | 10/1989 | Wagner | |
| 4,950,956 A | 8/1990 | Asamaki | |
| 5,016,564 A | 5/1991 | Nakamura | |
| 5,032,202 A | 7/1991 | Tsai | |
| 5,079,481 A | 1/1992 | Moslehi | |
| 5,081,398 A | 1/1992 | Asmussen | |
| 5,399,253 A | 3/1995 | Grunenfelder | |
| 5,411,624 A | 5/1995 | Hirano | |
| 5,449,977 A | 9/1995 | Nakagawa | |

(Continued)

FOREIGN PATENT DOCUMENTS

JP 04324631 11/1992

*Primary Examiner*—Parviz Hassanzadeh
*Assistant Examiner*—Michelle Crowell
(74) *Attorney, Agent, or Firm*—Wood, Herron & Evans, L.L.P.

(57) ABSTRACT

A magnetically enhanced plasma is produced with a permanent magnet assembly adjacent to a radio frequency (RF) biased wafer support electrode in a vacuum processing chamber of a semiconductor wafer processing apparatus. An annular peripheral region is provided on the wafer support around the perimeter of the wafer being processed. A magnet arrangement using a plurality of magnet rings forms a magnetic tunnel over the peripheral region at which the plasma is generated away from the wafer. The magnetic field has components parallel to the substrate support surface over the annular peripheral region but is generally isolated from the wafer. Preferably, the magnetic field has a flat portion parallel to the support surface in the peripheral region. Plasma propagates by diffusion from the peripheral region across the wafer surface. The magnets can be manipulated to optimize plasma uniformity adjacent the substrate being processed.

6 Claims, 3 Drawing Sheets

U.S. PATENT DOCUMENTS

| | | |
|---|---|---|
| 5,474,643 A | 12/1995 | Arami |
| 5,476,182 A | 12/1995 | Ishizuka |
| 5,484,485 A | 1/1996 | Chapman |
| 5,828,176 A | 10/1998 | Goebel |
| 6,027,603 A | 2/2000 | Holland |
| 6,030,486 A | 2/2000 | Loewenhardt |
| 6,074,512 A * | 6/2000 | Collins et al. .......... 156/345.29 |
| 6,132,576 A | 10/2000 | Pearson |
| 6,471,830 B1 | 10/2002 | Moslehi |
| 6,562,189 B1 | 5/2003 | Quiles |
| 2001/0032591 A1 | 10/2001 | Carducci |
| 2002/0142615 A1* | 10/2002 | Kanno ........................ 438/732 |
| 2003/0192646 A1* | 10/2003 | Wu et al. ................ 156/345.49 |

* cited by examiner

METHOD, APPARATUS AND MAGNET ASSEMBLY FOR ENHANCING AND LOCALIZING A CAPACITIVELY COUPLED PLASMA

This application is a divisional application of U.S. patent application Ser. No. 10/324,213, filed on Dec. 20, 2002 now U.S. Pat. No. 7,059,268.

FIELD OF THE INVENTION

This invention relates to the plasma processing of substrates, particularly semiconductor wafer substrates, and to the generation, enhancement and control of plasmas, particularly capacitively coupled plasmas, in such processing.

BACKGROUND OF THE INVENTION

Plasma is used in the production of semiconductors in processes such as plasma etching, ionized physical vapor deposition (iPVD) and plasma-enhanced chemical vapor deposition (PECVD). Plasma is often produced for such applications by capacitively coupling energy into a processing gas in a vacuum chamber to dissociate molecules of the gas into reactive free radicals and atoms, to excite molecules, radicals and ions of the gas into higher electronic states, to ionize molecules and atoms of reactive and inert gas, and to accelerate ions into trajectories normal to the surface of a substrate and onto the substrate.

In PECVD plasma processing applications, capacitive coupling may be used to dissociate and excite molecules of a processing gas into reactive free radicals so that a desired thin film can be grown on the substrate. In plasma etch applications, capacitive coupling of a plasma may be used to activate a process gas to remove material from the substrate, either by ionizing reactive atoms or radicals in a process known as reactive ion etching (RIE) or by ionizing atoms of inert gas in a process commonly referred to as sputter etching. In iPVD, a capacitively coupled plasma (CCP) may be used as a primary plasma source to produce ions of coating material or may be used to collimate the flux of coating material ions at the substrate or to ionize inert gas atoms and/or accelerate ions to the substrate in a post-deposition sputter etch step.

A simple CCP processing application involves the placing of a substrate on an electrode that is biased with radio frequency (RF) power. The electrode and substrate are enclosed in a grounded vacuum chamber that serves as an opposite electrode. This arrangement requires high and often excessive RF voltages to generate sufficient plasma density to perform the process efficiently. Such high voltages can damage devices in integrated circuits as well as cause arcing within the chamber. Further, with such systems, plasma uniformity and subsequently etch or deposition uniformity on the substrate are unpredictable and often unsatisfactory. Typically, etch and deposition uniformity are dependent on details of the process environment, such as the shapes of shields, the locations of gas injection ports, and other chamber features. Further, using a delicate substrate exclusively as an electrode usually results in excessive substrate temperature.

Attempts to overcome the limitations of CCPs described above have involved the use of magnetic enhancement near the substrate support electrode. This enhancement can be produced by use of a magnetic field of an appropriate magnitude oriented parallel to an RF biased substrate support to cause electrons near the electrode surface to move in cycloid orbits next to the plane of the electrode instead of moving away from it, as they would otherwise tend to do. As a result, the electrons in the plasma interact with the RF plasma sheath multiple times before being lost to the walls of the chamber. If the magnetic field forms a closed loop, the electrons have no fixed point of exit from the field and are trapped, potentially indefinitely, under the magnetic field. This trapping of electrons near the electrode surface results in larger amounts of energy being delivered to the electrons per volt of RF sheath potential. Hence, much smaller voltages are needed to achieve a given plasma density.

A major drawback of magnetic enhancement in the prior art plasma processing of integrated circuits is device damage due to non-uniform charging effects of the substrate. A non-uniform charge distribution along an insulated substrate surface results in voltage gradients across devices on the substrate, which can lead to voltage breakdown. Such a non-uniform charge distribution can be caused by lines of magnetic flux intersecting the substrate surface at predominantly normal angles of incidence across the surface of the substrate.

An example of a magnetic enhancement at the substrate support in the prior art is described in U.S. Pat. No. 5,449,977. The arrangement produces lines of magnetic field that are parallel to the surface of a substrate and act to induce cycloid orbits on a localized region of the substrate support called the cycloid region. The resulting non-uniform plasma can be made axially symmetric in a time-averaged sense by rotating the arrangement during processing of the wafers. A main drawback of this scheme is the need for costly and complex rotating hardware.

Accordingly, there remains a need for a method and apparatus for the maintenance of a substantially uniform low voltage plasma adjacent a semiconductor wafer substrate for plasma processing.

SUMMARY OF THE INVENTION

An objective of the present invention is to provide for the uniform distribution of a low voltage plasma across the surface of a substrate during processing, particularly in vacuum plasma processes for the manufacture of semiconductor wafers. A more particular objective of the invention is to provide a method, plasma source and processing apparatus for distributing a low-voltage high-density plasma at the surface of a wafer being processed that produces minimal charge distribution non-uniformity across the wafer and avoids wafer damage.

A further objective of the invention is to provide a magnetically enhanced plasma at the surface of a wafer that is useful for a variety of semiconductor manufacturing processes including but not limited to PECVD, iPVD, RIE and sputter etching.

According to principles of the present invention, a magnetically enhanced or magnetron plasma source is provided that operates to capacitively couple RF energy into an annular magnetic tunnel around the annular peripheral region of a wafer support surrounding a wafer supported on a central region of the support to form a plasma at an annular peripheral region from which the plasma diffuses inwardly over the wafer. The tunnel is produced by magnets configured adjacent the peripheral region and remote from the central region on which the wafer is supported. The magnets produce a magnetic field that is generally parallel to, or has substantial components that are parallel to, the surface of the support over the annular peripheral region. The field also is generally perpendicular to the support at the center of the central region and generally isolated from the support at the central region.

According to an embodiment of the invention, a plasma processing apparatus having a vacuum chamber is provided with a wafer support within the chamber having a central wafer supporting surface and an annular peripheral surface surrounding the central wafer supporting surface. An RF generator is coupled to the wafer support. An annular permanent magnet assembly is provided adjacent the annular peripheral surface of the wafer support. The assembly has two or more ring shaped magnet poles and is configured to form an annular magnetic tunnel adjacent the annular peripheral surface and surrounding the central wafer supporting surface so as to trap plasma forming electrons in the tunnel away from a wafer on the central wafer supporting surface. Plasma forms in the tunnel and diffuses inwardly from the tunnel over the surface of a wafer supported on the central wafer supporting surface.

In certain embodiments of the invention, an annular permanent magnet assembly is located behind the annular peripheral surface of the wafer support and produces the magnetic tunnel with a magnetic field arcing from the magnet poles through and over the surfaces of the support. In alternative embodiments, the annular permanent magnet assembly is located opposite and spaced from the annular peripheral surface of the wafer support and produces the magnetic tunnel with a magnetic field arcing from magnet poles toward and through the surfaces of the support. Preferably, the annular permanent magnet assembly is configured to produce a resultant magnetic field over the surfaces of the wafer support that includes resultant magnetic flux lines generally parallel to and over the annular peripheral surface, and generally perpendicular to and through the wafer supporting surface at the center so that the field is generally isolated from the support at the central region.

In certain embodiments of the invention, the annular permanent magnet assembly includes a high magnetic permeability material, an outer annular magnet ring and an inner annular magnet ring, the rings having opposite poles in contact with, or in close proximity to, the high magnetic permeability material.

The inner and outer annular magnet rings may have their polar axes perpendicular to the surfaces of the wafer support and oppositely oriented. Alternatively, the outer annular magnet ring has a polar axis perpendicular to the surfaces of the wafer support with a pole facing the annular peripheral surface of the wafer support while the inner annular magnetic ring has a polar axis parallel to the surfaces of the wafer support and its corresponding pole facing radially away from the central wafer supporting surface. The annular permanent magnet assembly preferably also has an intermediate magnet ring that has a polar axis parallel to the surface of the wafer support with its outwardly facing pole opposing the pole of the outer ring that faces the support.

The annular permanent magnet assembly is preferably configured to produce a magnetic field that is generally flat over at least a portion of the annular peripheral surface that lies radially outward of the periphery of a wafer on the support.

These and other objectives and advantages of the present invention will be more readily apparent from the following detailed description of the drawings.

DETAILED DESCRIPTION

Figure 1:
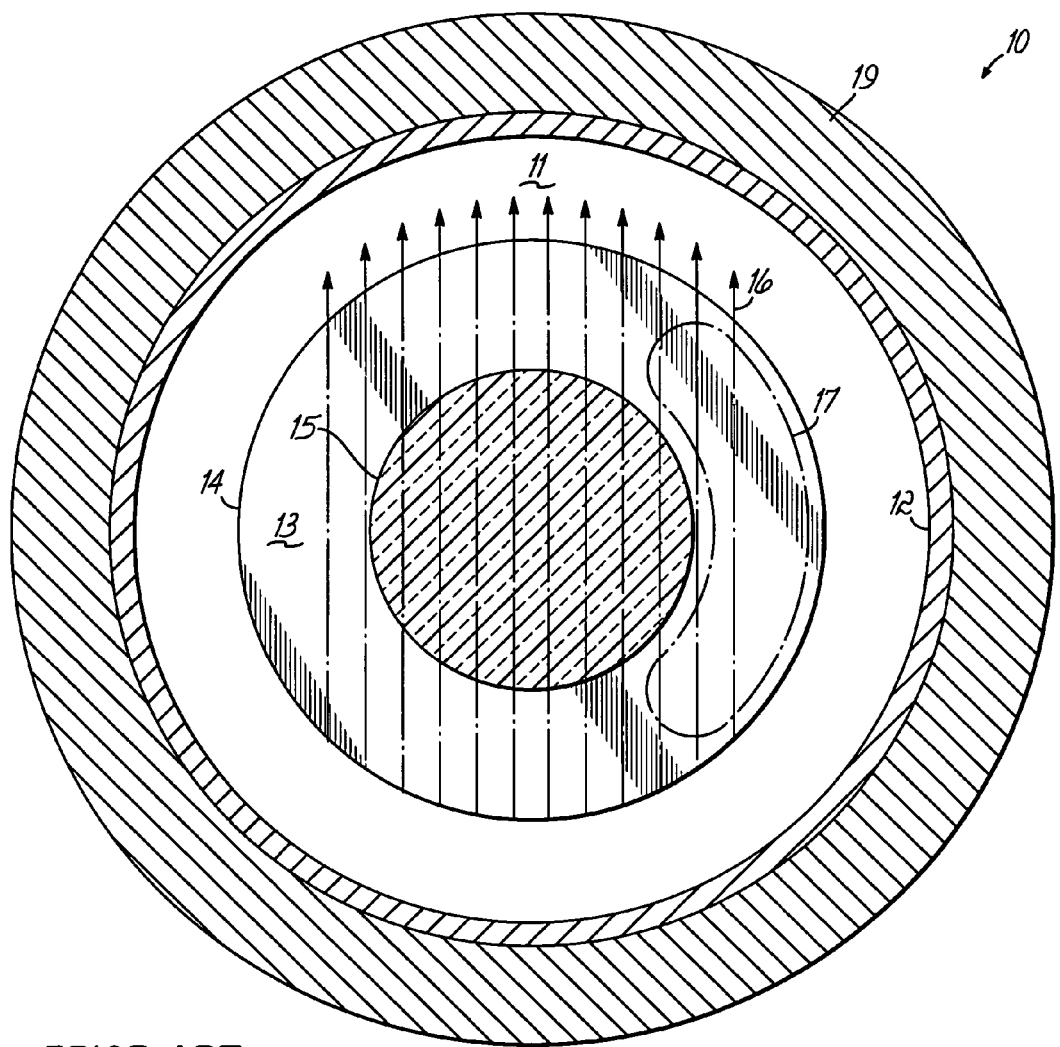
FIG. 1 is a cross-sectional view of a wafer processing chamber of the prior art employing magnetic enhancement of a plasma at a substrate support.

In the prior art plasma processing apparatus 10 of FIG. 1, a plasma processing chamber 11 is illustrated in cross-section through chamber wall 12 and facing a substrate supporting surface 13 of a substrate support 14 on which is centrally mounted a semiconductor wafer 15 for processing. Magnet structure 19, which may be outside of the chamber 11, generates a magnetic field 16 that is generally parallel to the substrate support surface 13. An RF generator (not shown) coupled to the support 14, capacitively couples RF energy into gas within the chamber 11 to energize a plasma. The plasma tends to be produced in a cycloid region 17 where cycloid orbits of electrons are induced by the RF energy in the presence of the magnetic field 16. The plasma is axially unsymmetrical and otherwise non-uniform. In such an apparatus 10, the plasma is frequently made axially symmetrical, in the time-averaged sense, by the use of a magnet arrangement that is made to rotate by costly and complex rotation hardware.

Figure 2:
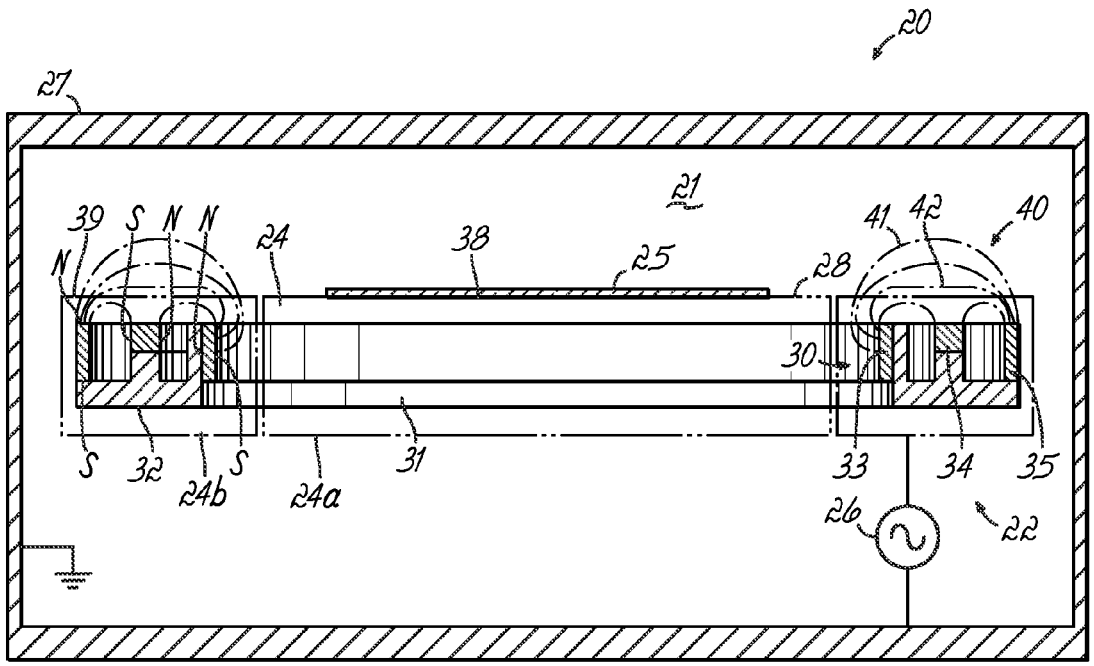
FIG. 2 is a cross-sectional view of a wafer processing chamber employing magnetic enhancement of a plasma at a substrate support according to an embodiment of the present invention using a magnet arrangement behind the substrate support surface.

FIG. 2 illustrates a plasma processing apparatus 20 having a magnetically enhanced plasma source 22 within a vacuum processing chamber 21. The source 22 is partially built into a semiconductor wafer substrate support 24, which is shown supporting a semiconductor wafer 25 for processing on the supporting surface 28 thereof. The substrate supporting surface 28 has a central surface region 38 concentric therewith, on which the wafer 25 is supported, and an annular peripheral surface region 39, which surrounds the central surface region 38 and is concentric with it. An RF generator 26, connected between the support 24 and grounded chamber wall 27, couples RF energy to the substrate support 24 which causes the support 24 to develop a negative DC bias with respect to the plasma. The central region 38 and the annular region may be two separate pieces, that are connected together or mounted in close proximity. The two separate pieces include a circular central piece 24a that has the central region 38 thereon and a surrounding annular piece 24b that has the annular peripheral surface region 39 thereon. Such two part construction facilitates impedance matching so that power is coupled through the substrate as well as the magnetron discharge.

Magnetic enhancement of the source 22 is provided by an annular permanent magnet assembly 30 arranged in the substrate support 24 behind the annular peripheral region 39 of the wafer supporting surface 28 of the support 24. This annular permanent magnet assembly 30 is, in practice, not a continuous annular ring but an annular ring that is broken into a number of segments that alternate with and without magnets, which allows plasma to diffuse toward the wafer more readily. A circular piece of high magnetic permeability material 31, such as mild steel, has an annular rim portion 32 that is configured to interface with a plurality of annular magnet rings, including an inner ring 33, an outer ring 35, and an intermediate ring 34. The inner ring 33 is oriented with its polar N/S axis parallel to the surface 28 in a radial direction while the outer ring 35 is oriented with its polar N/S axis perpendicular to the surface 28. The pole of the magnet 35 that is closest to the surface 28 is of the opposite polarity as the pole of the magnet 33 that faces the center of the support 24. The piece of magnetic material 31 is configured such that the polar axes of each of the magnets 33-35 are perpendicular to it. The material 31 creates a magnetic circuit between the magnet rings 33 and 35 and results in a magnetic field 40 of which lines of magnet flux 41 project from opposite poles of the respective magnets 33 and 35 into the processing space within the chamber 11. These flux lines 41 have a component parallel to the surface 28 but arc over it.

The intermediate magnet ring 34 is configured and arranged between the magnet rings 33 and 35 on the material 31 to divert magnetic flux lines from the magnet rings 33 and 35, producing resultant magnetic flux lines 42 which are generally flat and parallel to the surface 28. The polar axis of the intermediate magnetic ring 34 is parallel to the surface 28 and is oriented in a radial direction on the support 24 that is opposite that of the polar axis of magnet 33.

Figure 3:
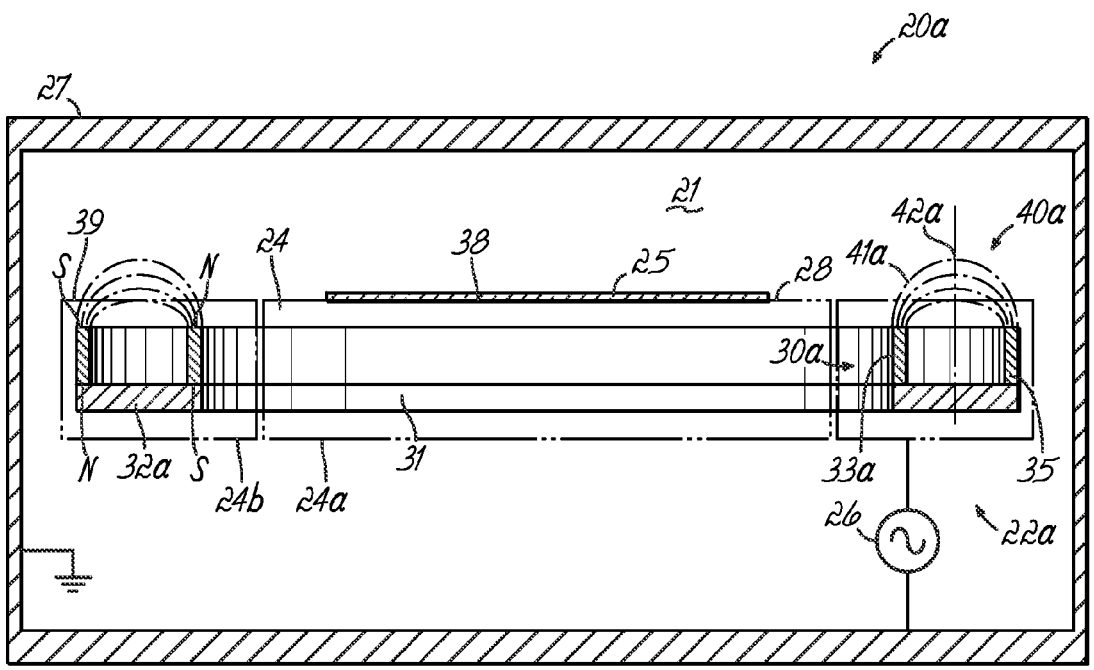
FIG. 3 is a cross-sectional view, similar to FIG. 2, of a wafer processing chamber employing magnetic enhancement of a plasma at a substrate support according to another embodiment of the present invention using a magnet arrangement behind the substrate support surface.

FIG. 3 illustrates an embodiment of an apparatus 20a having a source 22a that is similar to the source 22 with a magnet assembly 30a without the intermediate magnet ring 34. This embodiment has an inner ring 33a having a polar axis that is perpendicular to the surface 28 of the substrate support 24. The magnet rings 35 and 33a are supported on high permeability material 31a that is in the shape of a generally flat disk with a coplanar outer region 32a. The N/S polar axes of the magnets 33a and 35 are generally opposite. The magnets produce a magnetic field 40a that arcs over the peripheral surface region 29 of the support 24 with lines of flux 41a that have components parallel to the surface 28 but that are completely parallel to the surface 28 only along a line 42a.

Figure 4:
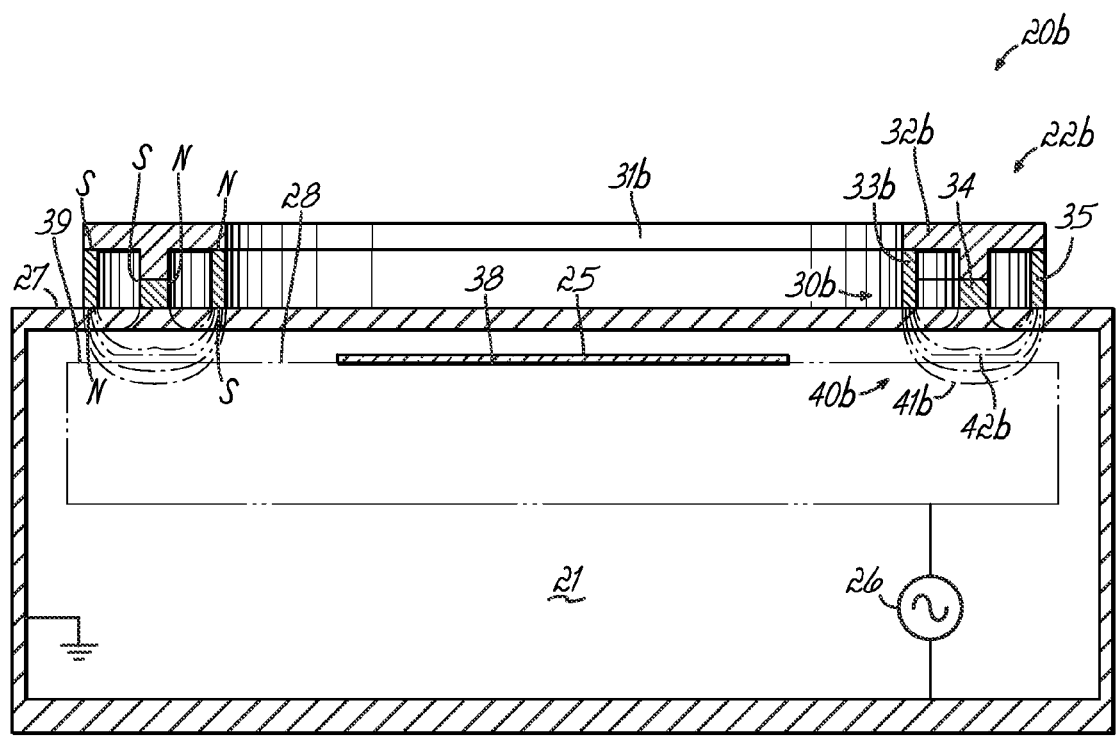
FIG. 4 is a cross-sectional view, similar to FIGS. 2 and 3, of a wafer processing chamber employing magnetic enhancement of a plasma at a substrate support according to an embodiment of the invention using a magnet arrangement opposite the substrate support surface and outside of the chamber.

FIG. 4 illustrates an embodiment of an apparatus 20b having a source 22b that is similar to the source 22 but with a magnet assembly 30b located outside of the chamber 11. This embodiment has an inner ring 33b having a polar axis that is perpendicular to the surface 28 of the substrate support 24. The magnet rings 33b, 34 and 35 are supported on high permeability material 31b that is in the shape of a generally flat disk 32b. The N/S polar axes of the magnets 33a and 35 are generally opposite. The magnets produce a magnetic field 40b that arcs through the peripheral surface region 39 from the opposing chamber wall, of flux 41b that have components parallel to the surface 28. This configuration is useful for etch applications and other applications which, unlike iPVD processing equipment, has space for the mounting of the magnet assembly at the chamber wall or outside the chamber 11.

Figure 5:
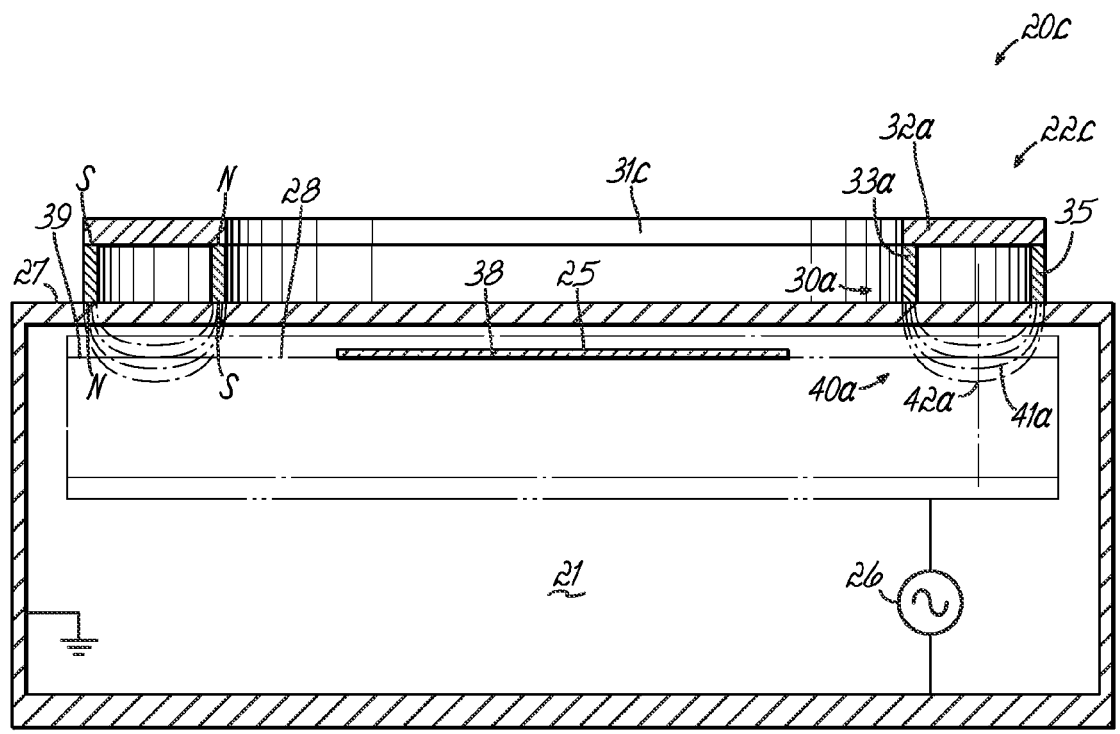
FIG. 5 is a cross-sectional view, similar to FIG. 4, of a wafer processing chamber employing magnetic enhancement of a plasma at a substrate support according to a further embodiment of the invention using a magnet arrangement opposite the substrate support surface and outside of the chamber.

FIG. 5 illustrates an embodiment of an apparatus 20c having a source 22c that has a magnet assembly similar to that of source 22a but is externally located similar to the source 22b.

The above description is of certain embodiments of the invention. Those skilled in the art will appreciate that various additions and modifications can be made without departing from the principles of the invention.

The invention claimed is:

1. A plasma processing apparatus comprising:
   a vacuum chamber;
   a wafer having a top surface, a diameter, and a circumferential edge;
   a wafer support within the vacuum chamber having:
      (a) a central wafer supporting member having a diameter that is substantially equal to the diameter of the wafer; and
      (b) a separate annular peripheral member surrounding the central wafer supporting surface and lying in a common plane with the central wafer supporting member, and wherein the annular peripheral member lies radially outward of the circumferential edge of the wafer;
   an RF generator coupled to the wafer support; and
   an annular permanent magnet assembly is located within the annular peripheral member of the wafer support, the annular permanent magnet assembly comprising:
      an outer annular magnet ring having a polar axis that is perpendicular to the central wafer supporting member of the wafer support; and
      an inner annular magnet ring having a polar axis that is perpendicular to the central wafer supporting member of the wafer support and the top surface of the wafer, wherein the polar axis of the inner annular magnet ring is opposite the polar axis of the outer annular magnet ring, wherein the inner and outer annular magnet rings are configured to form an annular magnetic tunnel above the annular peripheral member and surrounding the central wafer supporting member so as to trap plasma forming electrons in the annular magnetic tunnel and away from the top surface of the wafer and the central wafer supporting member such that a plasma formed in the annular magnetic tunnel diffuses inwardly from the annular magnetic tunnel and over the top surface of the wafer that is supported on the central wafer supporting member.

2. The plasma processing apparatus of claim 1, wherein the annular permanent magnet assembly further comprises:
   a piece of high magnetic permeability material supporting the outer and inner annular magnetic rings.

3. The plasma processing apparatus of claim 1, wherein the annular permanent magnet assembly is located behind the annular peripheral member of the wafer support, the annular permanent magnet assembly operable to produce a magnetic tunnel having a magnetic field that arches through and over a surface of the wafer support.

4. A plasma processing apparatus for processing a wafer having a top surface, a predetermined diameter, and a circumferential edge, the apparatus comprising:
   a vacuum chamber;
   a wafer support within the vacuum chamber having:
      (a) a central wafer supporting member having a diameter that is substantially equal to the predetermined diameter of the wafer; and
      (b) a separate annular peripheral member surrounding the central wafer supporting member and lying in a common plane with the central wafer supporting member, and wherein the annular peripheral member lies radially outward of the central wafer supporting member and radially outward of the circumferential edge of the wafer of the predetermined diameter when the wafer is supported and centered on the central wafer supporting member;

an RF generator coupled to the wafer support; and an annular permanent magnet assembly located within the annular peripheral member of the wafer support, the annular permanent magnet assembly comprising:

an outer annular magnet ring having a polar axis that is perpendicular to the common plane; and an inner annular magnet ring having a polar axis that is perpendicular to the common plane, wherein the polar axis of the inner annular magnet ring is opposite the polar axis of the outer annular magnet ring, wherein the inner and outer annular magnet rings are configured to form an annular magnetic tunnel above the annular peripheral member and surrounding the central wafer supporting member so as to trap plasma forming electrons in the annular magnetic tunnel and away from the central wafer supporting member such that a plasma formed in the annular magnetic tunnel diffuses inwardly from the annular magnetic tunnel and over the top surface of the wafer when the wafer is supported and centered on the central wafer supporting member.

5. The plasma processing apparatus of claim 4, wherein the annular permanent magnet assembly further comprises:

a piece of high magnetic permeability material supporting the outer and inner annular magnetic rings.

6. The plasma processing apparatus of claim 4, wherein the annular permanent magnet assembly is located behind the annular peripheral member, the annular permanent magnet assembly operable to produce a magnetic tunnel having a magnetic field that arches through and over a surface of the wafer support.

* * * * *

UNITED STATES PATENT AND TRADEMARK OFFICE
CERTIFICATE OF CORRECTION

PATENT NO. : 7,757,633 B2  Page 1 of 1
APPLICATION NO. : 11/315558
DATED : July 10, 2010
INVENTOR(S) : Derrek A. Russell It is certified that error appears in the above-identified patent and that said Letters Patent is hereby corrected as shown below:

<u>Column 6</u>

Line 11, "supporting surface" should be --supporting member--.

Signed and Sealed this

Second Day of November, 2010

David J. Kappos
*Director of the United States Patent and Trademark Office*